(12) United States Patent
Jiang et al.

(10) Patent No.: US 9,923,034 B2
(45) Date of Patent: Mar. 20, 2018

(54) DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Liangliang Jiang, Beijing (CN); Yongjun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/295,111

(22) Filed: Oct. 17, 2016

(65) Prior Publication Data
US 2017/0117330 A1 Apr. 27, 2017

(30) Foreign Application Priority Data
Oct. 23, 2015 (CN) .......................... 2015 1 0696680

(51) Int. Cl.
*H01L 27/32* (2006.01)
(52) U.S. Cl.
CPC .... *H01L 27/322* (2013.01); *H01L 2251/5323* (2013.01)
(58) Field of Classification Search
CPC ...................... H01L 27/322; H01L 2251/5323
See application file for complete search history.

(56) References Cited

U.S. PATENT DOCUMENTS

| 2001/0020990 A1* | 9/2001 | Moon .............. G02F 1/133514 349/96 |
| 2009/0147497 A1 | 6/2009 | Nada |
| 2011/0304263 A1 | 12/2011 | Xia et al. |

(Continued)

FOREIGN PATENT DOCUMENTS

| CN | 101451673 A | 6/2009 |
| CN | 102916138 A | 2/2013 |

OTHER PUBLICATIONS

First Office Action dated Sep. 28, 2017 in corresponding Chinese Patent Application No. 201510696680.X.

*Primary Examiner* — Phuc Dang
(74) *Attorney, Agent, or Firm* — Nath, Goldberg & Meyer; Joshua B. Goldberg; Annie J. Kock

(57) ABSTRACT

The present invention provides a display panel and a display device including the display panel. The display panel comprises a plurality of pixels each comprising at least a first sub-pixel, a second sub-pixel and a third sub-pixel, and each of the first sub-pixel, the second sub-pixel and the third sub-pixel comprises a light-emitting element emitting green light having a first wavelength. The first sub-pixel comprises a first conversion layer at a first light outgoing side of the light-emitting element thereof and emits light having a first color at the first light outgoing side of the light-emitting element thereof, and the second sub-pixel comprises a second conversion layer at a first light outgoing side of the light-emitting element thereof and emits light having a second color different from the first color at the first light outgoing side of the light-emitting element thereof.

20 Claims, 3 Drawing Sheets

(56) References Cited

U.S. PATENT DOCUMENTS

| | | | |
|---|---|---|---|
| 2014/0168576 A1* | 6/2014 | Lee | H01J 29/90 349/71 |
| 2016/0013249 A1* | 1/2016 | Wang | H01L 27/3211 257/40 |
| 2016/0025302 A1* | 1/2016 | Shiratori | H01L 27/3213 362/231 |
| 2017/0104045 A1* | 4/2017 | Hanamura | H01L 51/56 |
| 2017/0179438 A1* | 6/2017 | Xu | H01L 51/5281 |

* cited by examiner in# DISPLAY PANEL AND DISPLAY DEVICE

FIELD OF THE INVENTION

The present invention relates to the field of display technology, and specifically relates to a display panel and a display device.

BACKGROUND OF THE INVENTION

In the prior art, color display is generally implemented by white light in conjunction with a color filter. FIG. 1 illustrates an example of an organic light-emitting diode (OLED) display panel in the prior art. As shown in FIG. 1, the OLED display panel includes a base substrate 10, and a cathode 11, an anode 13, and a light-emitting material layer 12 between the cathode 11 and the anode 13, which are formed on the base substrate 10. In FIG. 1, one pixel including three sub-pixels on the display panel is illustrated, and the light-emitting material layer 12 corresponding to each sub-pixel emits white light (W). In addition, the display panel further includes a color filter layer 14, and the white light emitted by the light-emitting material layer 12 is converted into red light (R), green light (G) and blue light (B) after passing through the color filter layer 14. This solution in the prior art has a relatively low light transmittance due to the color filter layer 14, and the displayed color resulting from color filtration by the color filter layer 14 may degrade the display effect.

SUMMARY OF THE INVENTION

Embodiments of the present invention provide a display panel and a display device, which can achieve color display without using a color filter, thereby improving the light transmittance of the display panel.

According to one aspect of the present invention, there is provided a display panel, including a plurality of pixels each including at least a first sub-pixel, a second sub-pixel and a third sub-pixel, and each of the first sub-pixel, the second sub-pixel and the third sub-pixel includes a light-emitting element emitting green light having a first wavelength. The first sub-pixel includes a first conversion layer at a first light outgoing side of the light-emitting element thereof and emits light having a first color at the first light outgoing side of the light-emitting element thereof, the second sub-pixel includes a second conversion layer at a first light outgoing side of the light-emitting element thereof and emits light having a second color at the first light outgoing side of the light-emitting element thereof, and the second color is different from the first color.

According to the embodiments of the present invention, one of the light having the first color and the light having the second color may have a wavelength smaller than the first wavelength, and the other of the light having the first color and the light having the second color may have a wavelength larger than the first wavelength.

According to the embodiments of the present invention, the third sub-pixel may include a third conversion layer at a first light outgoing side of the light-emitting element thereof, and may emit green light having a second wavelength at the first light outgoing side of the light-emitting element thereof, the second wavelength is different from the first wavelength.

According to the embodiments of the present invention, the first wavelength and the second wavelength may be in a range of 520 nm to 580 nm.

According to the embodiments of the present invention, the light having the first color may have a wavelength in a range of 410 nm to 480 nm, and the light having the second color may have a wavelength in a range of 620 nm to 1000 nm.

According to the embodiments of the present invention, two of the first sub-pixel, the second sub-pixel and the third sub-pixel may further include a fourth conversion layer and a fifth conversion layer at second light outgoing sides of the light-emitting elements thereof, respectively, and may emit light having a third color and light having a fourth color at the second light outgoing sides of the light-emitting elements thereof, respectively. The fourth color is different from the third color.

According to the embodiments of the present invention, one of the light having the third color and the light having the fourth color may have a wavelength smaller than the first wavelength, and the other of the light having the third color and the light having the fourth color may have a wavelength larger than the first wavelength.

According to the embodiments of the present invention, the wavelength of the light having the first color may be the same as that of the light having the third color, and the wavelength of the light having the second color may be the same as that of the light having the fourth color.

According to the embodiments of the present invention, the display panel may further include an upper substrate for providing the first conversion layer and the second conversion layer, and a lower substrate for providing the light-emitting elements.

According to the embodiments of the present invention, the display panel may further include an upper substrate for providing the first conversion layer and the second conversion layer, and a lower substrate for providing the light-emitting elements, the fourth conversion layer and the fifth conversion layer.

According to the embodiments of the present invention, the light-emitting element is an OLED device.

According to another aspect of the present invention, there is provided a display device, including the display panel according to the present invention.

In the display panel and the display device according to the present invention, the light-emitting element in each pixel emits green light having the first wavelength, and in each pixel, the first sub-pixel includes the first conversion layer, and the second sub-pixel includes the second conversion layer, so that the green light emitted by the light-emitting element in the first sub-pixel is converted, after passing through the first conversion layer, into light having a first color whose wavelength is different from the first wavelength, and the green light emitted by the light-emitting element in the second sub-pixel is converted, after passing through the second conversion layer, into light having a second color whose wavelength is different from the first wavelength. The light having the second color is different from the light having the first color. Because light emitted by the light-emitting element only have its wavelength changed after passing through the conversion layer, the brightness of light will not be lowered, and compared to the solution of using a color filter in the prior art, the display panel according to the present invention has a higher light transmittance.

BRIEF DESCRIPTION OF THE DRAWINGS

The exemplary embodiments of the inventive concept will be understood more clearly through the following description with reference to the accompanying drawings. In the drawings.

DETAILED DESCRIPTION OF THE EMBODIMENTS

Figure 1:
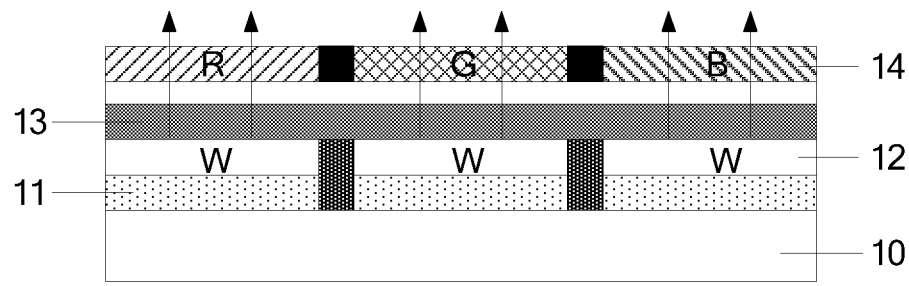
FIG. 1 illustrates an example of an organic light-emitting diode (OLED) display panel in the prior art.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, the thicknesses and sizes of layers are exaggerated for clarity and ease of description.

It will be understood that the terms such as "first," "second," "third" and the like may be used herein to describe various elements, components, areas, layers and/or parts, but these elements, components, areas, layers and/or parts should not be limited by these terms. Such terms are merely used to distinguish one element, component, area, layer or part from another element, component, area, layer or part. Thus, a first element, a first component, a first area, a first layer or a first part discussed below may be referred to as a second element, a second component, a second area, a second layer or a second part without departing from the teachings of the present invention.

Spatially relative terms, such as "above," "upper", "below," "lower," and the like, may be used herein to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "above" other elements or features would then be oriented "below" the other elements or features. Thus, the exemplary term "above" can encompass both orientations of above and below. The element may be otherwise oriented (rotated by 90 degrees or at other orientations) and the spatially relative descriptors used herein may be interpreted accordingly.

Figure 2:
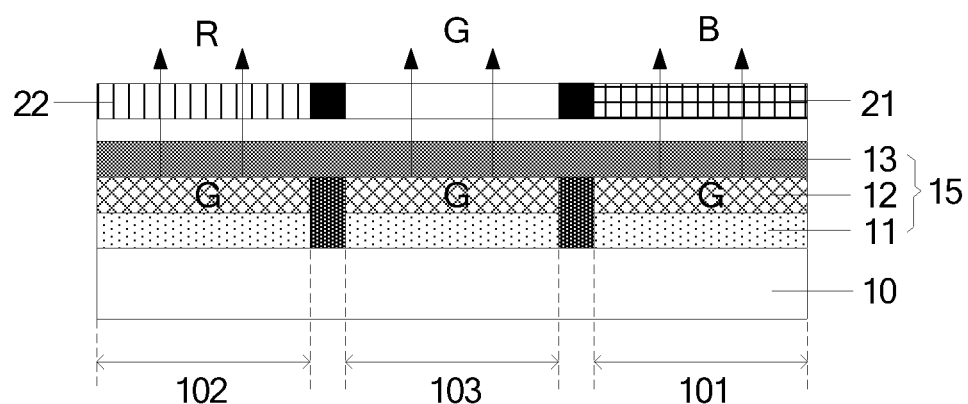
FIG. 2 is a schematic diagram illustrating an OLED display panel according to an embodiment of the present invention.

FIG. 2 is a schematic diagram illustrating an OLED display panel according to an embodiment of the present invention.

As shown in FIG. 2, the display panel according to an embodiment of the present invention may include a plurality of pixels (only one pixel is shown in FIG. 2), each pixel includes at least a first sub-pixel 101, a second sub-pixel 102 and a third sub-pixel 103, and each of the first sub-pixel 101, the second sub-pixel 102 and the third sub-pixel 103 includes a light-emitting element 15 emitting green light G having a first wavelength. According to embodiments of the present invention, the light-emitting element 15 may be an OLED device including a cathode 11, an anode 13 and a light-emitting material layer 12 provided between the cathode 11 and the anode 13. In addition, the display panel may further include a base substrate 10 for forming the light-emitting element 15.

As shown in FIG. 2, the first sub-pixel 101 includes a first conversion layer 21 at a first light outgoing side of the light-emitting element 15 thereof, and emits light having a first color (e.g., blue light B) at the first light outgoing side of the light-emitting element 15 thereof. The second sub-pixel 102 includes a second conversion layer 22 at a first light outgoing side of the light-emitting element 15 thereof, and emits light having a second color (e.g., red light R), which is different from the first color, at the first light outgoing side of the light-emitting element 15 thereof.

It should be noted that, FIG. 2 illustrates a case where the OLED device is used as the light-emitting element 15 of each sub-pixel, but the inventive concept is not limited thereto. According to embodiments of the present invention, the light-emitting element 15 may be an electrophoretic light emitting device, a liquid crystal light-emitting device, an OLED device, or the like. Thereinafter, detailed description is given by taking a case where the light-emitting element is an OLED device as an example.

In addition, FIG. 2 illustrates a case where each pixel includes a first sub-pixel, a second sub-pixel and a third sub-pixel, but the inventive concept is not limited thereto. According to embodiments of the present invention, each pixel may include a first sub-pixel, a second sub-pixel, a third sub-pixel and a fourth sub-pixel. Thereinafter, detailed description is given by taking a case where each pixel includes a first sub-pixel, a second sub-pixel and a third sub-pixel as an example.

According to embodiments of the present invention, the light-emitting element in each sub-pixel emits green light G having the first wavelength. One of the light having the first color emitted by the first sub-pixel 101 and the light having the second color emitted by the second sub-pixel 102 may have a wavelength smaller than the first wavelength, and the other may have a wavelength larger than the first wavelength. For example, the first sub-pixel 101 emits blue light B whose wavelength is smaller than the first wavelength, the second sub-pixel 102 emits red light R whose wavelength is larger than the first wavelength, and the third sub-pixel 103 emits green light G having the first wavelength. For example, the light having the first color may be blue light B having a wavelength in a range of 410 nm to 480 nm, the light having the second color may be red light R having a wavelength in a range of 620 nm to 1000 nm, and the first wavelength of the green light G emitted by the light-emitting element may be in a range of 520 nm to 580 nm. Because light emitted by the light-emitting element only has its wavelength (i.e., color) changed after passing through the conversion layer, the brightness of light will not be lowered, and thus a higher light transmittance can be achieved.

In addition, in the case where the light-emitting element is an OLED device, because a light-emitting material emitting green light has a longer service life than those emitting red light and/or blue light, the display panel according to the embodiments of the present invention has a longer service life.

According to an embodiment of the present invention, the conversion layer may be made of an inorganic light conversion agent, which is formed by using a metal sulfide as a matrix and doping the matrix with rare earth luminescent particles or other metal activated particles. For example, the conversion layer used for converting green light into blue light may be made of a rare earth inorganic blue light agent, which can absorb green light having a wavelength of about 550 nm and emit blue light having a wavelength of about 430 nm. For example, the conversion layer used for converting green light into red light may be made of a rare earth inorganic red light agent, which can absorb green light having a wavelength of about 550 nm and emit red light having a wavelength of about 650 nm.

FIGS. 3 to 7 are schematic diagrams illustrating OLED display panels according to other embodiments of the present invention.

Figure 3:
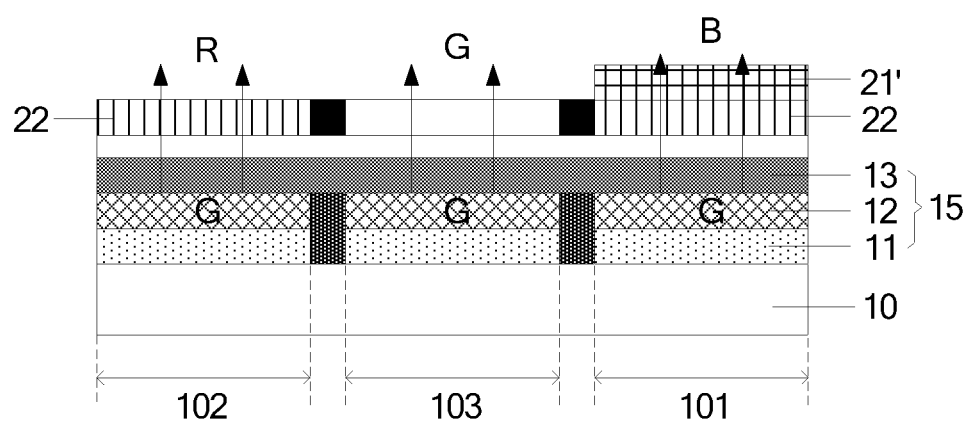
FIG. 3 is a schematic diagram illustrating an OLED display panel according to another embodiment of the present invention.

As shown in FIG. 3, the first sub-pixel 101 may include a second conversion layer 22 provided between the light-emitting element 15 and the first conversion layer 21'. Like the second conversion layer 22 provided in the second sub-pixel 102, the second conversion layer 22 provided in the first sub-pixel 101 emits light having the second color. Therefore, the first conversion layer 21' may absorb the light having the second color and emit light having the first color. For example, in the first sub-pixel 101, green light G emitted by the light-emitting element 15 is converted into red light R by the second conversion layer 22, and in this case, the first conversion layer 21' may absorb the red light and emit blue light, so that the first sub-pixel 101 emits blue light B.

Figure 4:
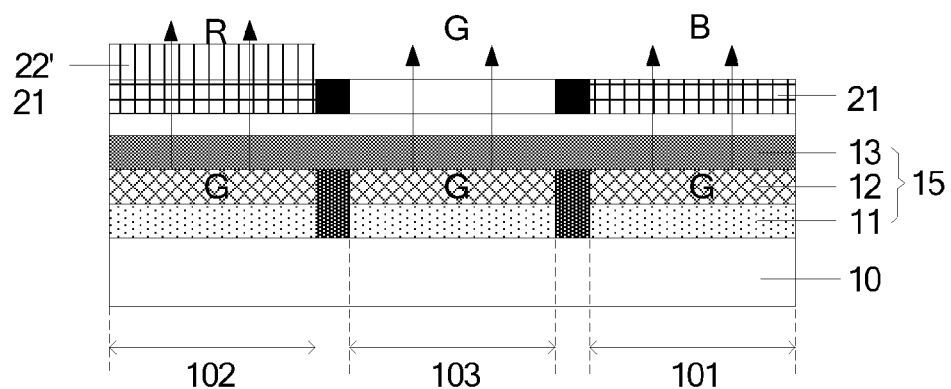
FIG. 4 is a schematic diagram illustrating an OLED display panel according to still another embodiment of the present invention.

Alternatively, as shown in FIG. 4, the second sub-pixel 102 may include a first conversion layer 21 provided between the light-emitting layer 15 and the second conversion layer 22'. Like the first conversion layer 21 provided in the first sub-pixel 101, the first conversion layer 21 provided in the second sub-pixel 102 emits light having the first color. Therefore, the second conversion layer 22' may absorb the light having the first color and emit light having the second color. For example, in the second sub-pixel 102, green light G emitted by the light-emitting element 15 is converted into blue light B by the first conversion layer 21, and in this case, the second conversion layer 22' may absorb the blue light and emit red light, so that the second sub-pixel 102 emits red light R.

Figure 5:
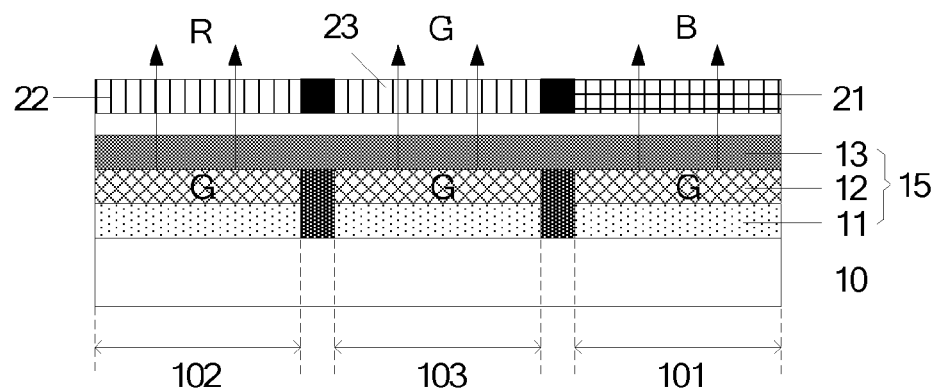
FIG. 5 is a schematic diagram illustrating an OLED display panel according to yet another embodiment of the present invention.

As shown in FIG. 5, the light-emitting element 15 emit green light G having the first wavelength, and the third sub-pixel 103 may include a third conversion layer 23 at a first light outgoing side of the light-emitting element thereof, and emit green light G' having a second wavelength different from the first wavelength. For example, the light-emitting element 15 may emit green light G having a wavelength of about 490 nm, and the third conversion layer 23 may absorb the green light G having a wavelength of about 490 nm and emit green light G' having a wavelength of about 550 nm. Alternatively, the light-emitting element 15 may emit green light G having a wavelength of about 570 nm, and the third conversion layer 23 may absorb the green light G having a wavelength of about 570 nm and emit green light G' having a wavelength of about 490 nm. That is, by providing the third conversion layer 23 in the third sub-pixel 103, green light G emitted by the light-emitting element 15 can be adjusted to green light G' having a longer or shorter wavelength, so as to meet various display demands. Similar to the first wavelength, the second wavelength may be in the range of 520 nm to 580 nm.

It should be noted that, so far, it has been found that many inorganic materials doped with rare earth particles can convert light having a longer wavelength into light having a shorter wavelength. It is generally considered that light with higher energy can excite light with lower energy (i.e., Stokes Law). In other words, light having a shorter wavelength and a higher frequency can excite light having a longer wavelength and a lower frequency (i.e., down-conversion luminescence). For example, blue light can excite yellow light, or visible light can excite infrared light. However, studies have found that some materials can achieve light excitation effect contrary to the above law, and thus it is referred to as anti-stokes luminescent (also referred to as up-conversion luminescent), such as Y20:Yb,Er, LaF:Yb,Er or NaYF:Yb,Er/Tm. NaYF:Yb,Er/Tm is taken as an example, where Yb is an sensitizer, and Er or Tm is an activator. Studies have found that intensity and color of light vary as doping ratio of the activator to the sensitizer varies. Therefore, the wavelength of the generated light can be adjusted by changing the doping ratio of the activator to the sensitizer in the material for forming the conversion layer.

Figure 6:
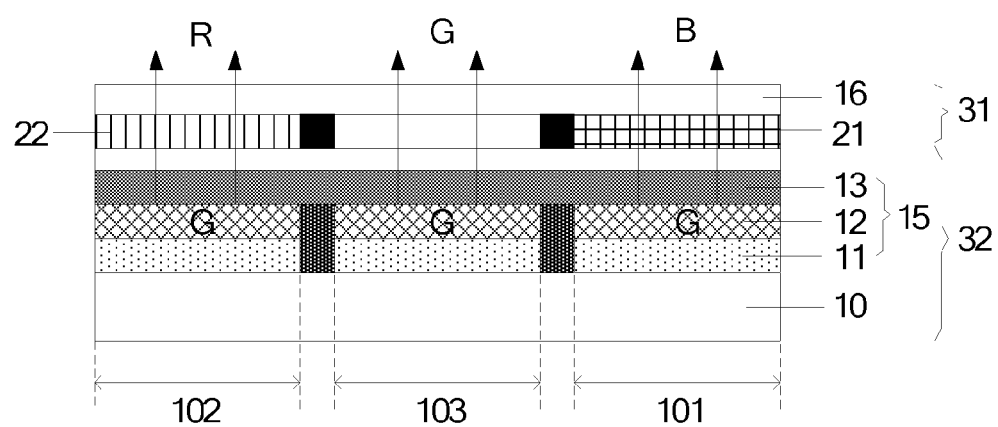
FIG. 6 is a schematic diagram illustrating an OLED display panel according to still another embodiment of the present invention.

As shown in FIG. 6, the display panel may include an upper substrate 31 for providing the first conversion layer 21 and the second conversion layer 22, and a lower substrate 32 for providing the light-emitting elements 15. The upper substrate 31 may include a package substrate 16 and the first conversion layer 21 and the second conversion layer 22 formed on the package substrate 16. The lower substrate 32 may include the base substrate 10 and the light-emitting elements 15 formed on the base substrate 10.

According to an embodiment of the present invention, the first conversion layer 21 and the second conversion layer 22 may be formed on the package substrate 16 by means of evaporation. Since the first conversion layer 21 and the second conversion layer 22 are located in the upper substrate 31, the processes of forming the first conversion layer 21 and the second conversion layer 22 will not influence the fabrication of the lower substrate 32, so as to avoid lowered yield resulted from interaction between processes in the case of forming all layers on the same substrate.

Figure 7:
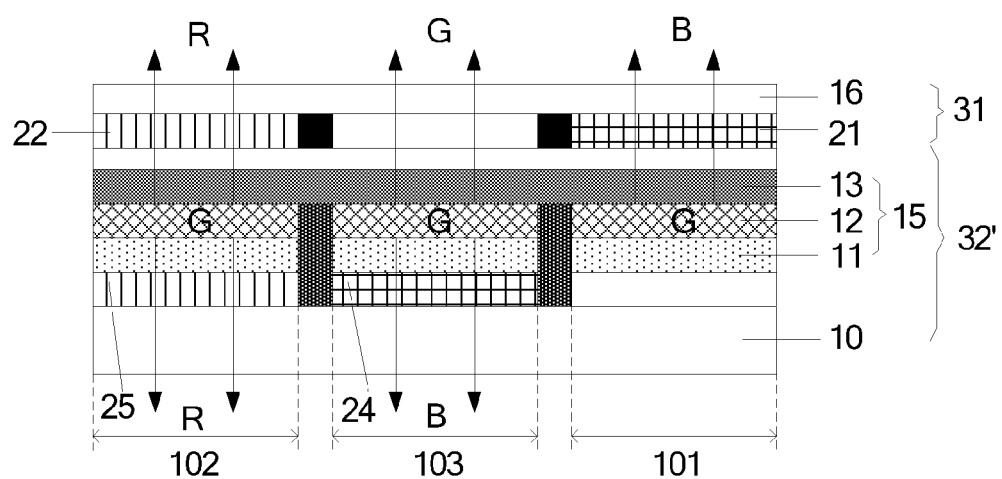
FIG. 7 is a schematic diagram illustrating an OLED display panel according to still another embodiment of the present invention.

As shown in FIG. 7, according to an embodiment of the present invention, two of the first sub-pixel 101, the second sub-pixel 102 and the third sub-pixel 103 may further include a fourth conversion layer 24 and a fifth conversion layer 25 at second light outgoing sides of the light-emitting elements 15 thereof, respectively, and may emit light having a third color and light having a fourth color at the second light outgoing sides of the light-emitting elements 15 thereof, respectively. The fourth color is different from the third color. Similar to the light having the first color and the light having the second color, one of the light having the third color and the light having the fourth color may have a wavelength smaller than the first wavelength, and the other may have a wavelength larger than the first wavelength. According to an embodiment of the present invention, the light having the first color and the light having the third color may have the same wavelength, and the light having the second color and the light having the fourth color may have the same wavelength.

As shown in FIG. 7, for example, the third sub-pixel 103 includes the fourth conversion layer 24 at the second light outgoing side of the light-emitting element 15, and thus can emit light having the third color at the second light outgoing side of the light-emitting element 15. In addition, the second sub-pixel 102 includes the fifth conversion layer 25 at the second light outgoing side of the light-emitting element 15, and thus can emit light having the fourth color at the second light outgoing side of the light-emitting element 15. For example, the light having the third color may be the same blue light B as the light having the first color, and, the light having the fourth color may be the same red light R as the light having the second color.

According to the embodiment shown in FIG. 7, a double-sided display panel can be implemented. In addition, although not shown in figures, additional conversion layer(s) may be provided to further adjust the wavelength of emitted light, similar to the embodiments described with reference to FIGS. 3 to 5.

As shown in FIG. 7, the display panel includes an upper substrate 31 for providing the first conversion layer 21 and the second conversion layer 22, and a lower substrate 32' for providing the light-emitting elements 15, the fourth conversion layer 24 and the fifth conversion layer 25.

The display panel according to the embodiments of the present invention may be applied to various display devices, which include (but are not limited to) display devices such as liquid crystal displays, electronic paper, OLED displays, etc., and any products or components having a display function and including these display devices, such as televisions, digital cameras, mobile phones, tablet computers, etc.

The present inventive concept has been illustrated and described with reference to the exemplary embodiments of the inventive concept, but it should be understood that various changes in form and detail may be made in the exemplary embodiments without departing from the spirit and scope of the appended claims.

What is claimed is:

1. A display panel, comprising a plurality of pixels each comprising at least a first sub-pixel, a second sub-pixel and a third sub-pixel, and each of the first sub-pixel, the second sub-pixel and the third sub-pixel comprising a light-emitting element that emits green light having a first wavelength,
    wherein the first sub-pixel comprises a first conversion layer at a first light outgoing side of the light-emitting element thereof, the first conversion layer being configured to receive the green light having the first wavelength emitted from the light-emitting element of the first sub-pixel and emit light having a first color,
    wherein the second sub-pixel comprises a second conversion layer at a first light outgoing side of the light-emitting element thereof, the second conversion layer being configured to receive the green light having the first wavelength emitted from the light-emitting element of the second sub-pixel and emit light having a second color, and
    wherein the first color, the second color, and green color are different.

2. The display panel according to claim 1, wherein one of the light having the first color and the light having the second color has a wavelength smaller than the first wavelength, and the other of the light having the first color and the light having the second color has a wavelength larger than the first wavelength.

3. The display panel according to claim 1, wherein the third sub-pixel comprises a third conversion layer at a first light outgoing side of the light-emitting element thereof, and emits green light having a second wavelength at the first light outgoing side of the light-emitting element thereof, the second wavelength is different from the first wavelength.

4. The display panel according to claim 3, wherein the first wavelength and the second wavelength are in a range of 520 nm to 580 nm.

5. The display panel according to claim 1, wherein the light having the first color has a wavelength in a range of 410 nm to 480 nm, and the light having the second color has a wavelength in a range of 620 nm to 1000 nm.

6. The display panel according to claim 1, wherein two of the first sub-pixel, the second sub-pixel and the third sub-pixel further comprise a fourth conversion layer and a fifth conversion layer at second light outgoing sides of the light-emitting elements thereof, respectively, and emit light having a third color and light having a fourth color at the second light outgoing sides of the light-emitting elements thereof, respectively, the fourth color is different from the third color.

7. The display panel according to claim 6, wherein the light having the first color and the light having the third color have a same wavelength, and the light having the second color and the light having the fourth color have a same wavelength.

8. The display panel according to claim 1, wherein the display panel further comprises an upper substrate for providing the first conversion layer and the second conversion layer, and a lower substrate for providing the light-emitting elements.

9. The display panel according to claim 6, wherein the display panel further comprises an upper substrate for providing the first conversion layer and the second conversion layer, and a lower substrate for providing the light-emitting elements, the fourth conversion layer and the fifth conversion layer.

10. The display panel according to claim 1, wherein the light-emitting element is an OLED device.

11. A display device, comprising the display panel according to claim 1.

12. The display device according to claim 11, wherein one of the light having the first color and the light having the second color has a wavelength smaller than the first wavelength, and the other of the light having the first color and the light having the second color has a wavelength larger than the first wavelength.

13. The display device according to claim 11, wherein the third sub-pixel comprises a third conversion layer at a first light outgoing side of the light-emitting element thereof, and emits green light having a second wavelength at the first light outgoing side of the light-emitting element thereof, the second wavelength is different from the first wavelength.

14. The display device according to claim 13, wherein the first wavelength and the second wavelength are in a range of 520 nm to 580 nm.

15. The display device according to claim 11, wherein the light having the first color has a wavelength in a range of 410 nm to 480 nm, and the light having the second color has a wavelength in a range of 620 nm to 1000 nm.

16. The display device according to claim 11, wherein two of the first sub-pixel, the second sub-pixel and the third sub-pixel further comprise a fourth conversion layer and a fifth conversion layer at second light outgoing sides of the light-emitting elements thereof, respectively, and emit light having a third color and light having a fourth color at the second light outgoing sides of the light-emitting elements thereof, respectively, the fourth color is different from the third color.

17. The display device according to claim 16, wherein the light having the first color and the light having the third color have a same wavelength, and the light having the second color and the light having the fourth color have a same wavelength.

18. The display device according to claim 11, wherein the display panel further comprises an upper substrate for providing the first conversion layer and the second conversion layer, and a lower substrate for providing the light-emitting elements.

19. The display device according to claim 16, wherein the display panel further comprises an upper substrate for providing the first conversion layer and the second conversion layer, and a lower substrate for providing the light-emitting elements, the fourth conversion layer and the fifth conversion layer.

20. The display device according to claim 11, wherein the light-emitting element is an OLED device.

\* \* \* \* \*